United States Patent Office 3,691,007

Patented Sept. 12, 1972

3,691,007

PRINTED CIRCUIT BOARD FABRICATION BY ELECTROPLATING A SURFACE THROUGH A POROUS MEMBRANE

James Pavlou, Sherman Oaks, Calif., assignor to The Mica Corporation, Culver City, Calif.

No Drawing. Filed Aug. 14, 1969, Ser. No. 850,248
Int. Cl. B01k *3/00;* C23b *5/48*
U.S. Cl. 161—213 12 Claims

ABSTRACT OF THE DISCLOSURE

The present patent describes a printed circuit board material comprising a rigid plastic substrate, a resistive layer carried on said substrate and a conductive film carried on said resistive layer; the improvement wherein the resistive layer is applied to a preformed conductive layer through a porous, polymeric membrane.

BACKGROUND OF THE INVENTION

The field of the present invention pertains to printed circuit board materials capable of producing conductive and resistive electrical effects.

Conventional printed circuit board materials are used to produce patterns of conductors on an essentially two dimensional board. As the circuit requirements call for functions other than conduction, discrete components must be attached to the conductive pattern one by one. For instance, resistors are used in great numbers in many applications. It is not at all unusual to find individual printed circuits containing scores of resistors, each of which had to be purchased, inventoried, mounted, and soldered to the circuit board—frequently by hand. It would be desirable to have available materials and methods by which resistors could be produced in place on the printed circuit at essentially the same time as the conductors, thereby eliminating the expensive time consuming steps mentioned above. Attempts have been made to produce such a polyfunctional printed circuit board by adhering multilayer foils to an insulating substrate. The foils were composed of layers of different materials in electrical contact with adjacent layers. For instance, in cases wherein it was desired to produce conductive and resistive functions, a two layer foil of conductive and resistive materials was made and adhered to an insulating substrate. By appropriately etching these layers, selectively and sequentially, patterns of resistors could be formed in one layer and patterns of conductors in the other. These early attempts to make polyfunctional printed circuit board materials were deficient in at least two important areas: (1) difficulty of producibility of the stock, and (2) the poor qualities of the resistors that could be made therewith. The present invention describes ways by which these difficulties can be remedied. In particular, it tells how a polyfunctional stock material can be made to produce patterns of conductors and resistors wherein all the resistors can be made to narrow tolerance and wherein this narrow tolerance is repeatable from board to board.

SUMMARY OF THE INVENTION

Briefly, the present invention relates to a printed circuit board material comprising a rigid plastic substrate, a resistive layer carried on said substrate and a conductive film carried on said resistive layer; the improvement wherein the resistive layer is applied to a preformed conductive layer through a porous polymeric membrane. The present invention also comprehends the method of fabrication of printed circuit board material by applying a porous, polymeric membrane to a preformed conductive layer, applying a resistive layer to said conductive layer through the membrane, and subsequently adhering said resistive layer to a substrate.

Accordingly, it is the object of the present invention to provide a novel means for the fabrication of printed circuit board material.

It is a particular object of this invention to apply the resistive layer to a preformed conductive metal foil through a porous, polymeric membrane.

These and other objects and advantages of the invention will be apparent from the more detailed description which follows.

DESCRIPTION OF PREFERRED EMBODIMENTS

According to the present invention, the improved printed circuit board material can be fabricated in a number of ways. The preferred technique according to our invention is to pre-coat a conductive metal foil such as copper with a porous, polymeric membrane, and then to electrodeposit the resistive layer through microscopic holes in the membrane. The membrane is then removed with solvent, and the resultant bimetal foil laminated with several plies of woven cloth impregnated with a curable organic resin. The resistive-conductive film prepared as described can also be bonded to a substrate with an adhesive.

The printed circuit board material of this invention can be selectively photoresisted and etched to form conductive traces or resistors by means known to those skilled in the art.

The present invention provides a major advance in the printed circuit board art by significantly improving the quality of the board. Accordingly, it is to be anticipated that the invention will be widely adopted in those applications where printed circuits are currently in use.

The following examples are presented solely to illustrate the invention and should not be regarded as limiting in any way. In the examples, the parts and percentages are by weight unless otherwise indicated.

Example I

A copper foil was dipped into a 1% dimethylformamide solution of polyvinylidene fluoride. A porous, polymeric membrane formed on the foil. The foil was then electrolytically coated with nickel. The membrane was then removed by dipping the bimetallic strip in dimethylformamide. The strip was then laminated to several glass cloths which had been impregnated with curable epoxy resin. Resistance reading taken across the width of 5" x 8" panels yielded sheet resistance uniformities within the ±10% range.

Example II

A section of one ounce, electroplated copper foil was coated by dipping it into a 0.1% solution of cellulose triacetate in trichloroethane. The coating; a porous, polymeric membrane; was allowed to air dry. The dull, or "solution" side of the foil then was electroplated with nickel at 70 amps per square foot for 20 seconds. Following the nickel plating, the membrane was removed by washing the foil in trichloroethane. The plated foil was laminated, nickel side at the interface, to several plies of fiberglass cloth preimpregnated with B-staged, curable epoxy resin. The "shiny" side of the copper then was scrubbed clean, dried, and sprayed with KPR photoresist. The photoresist coating was baked at 250° F. for 12 minutes and then exposed to an appropriate light source through a negative containing a composite of the desired resistor/conductor pattern. The exposed surface was developed in photoresist developer and washed. The portion of the copper surface which then was unprotected was etched with ferric chloride in a spray etcher. The underlying nickel layer then was etched with MU etchant (MacDermid Co.). The panel was rinsed in water and the photoresist pattern was removed with a commercial stripper. A new coating of photoresist was applied in the manner described above. With careful attention to precise registration, a negative containing only the conductor pattern was affixed to the panel and the sensitized surface was exposed through this negative. The photoresist coating was developed and washed as described above and the copper overlaying the resistor pattern was etched away with ferric chloride. The photoresist remaining over the conductor pattern was stripped off and the panel, now with resistor and conductor patterns completed, was washed and dried. A typical pattern of twelve 50 square resistors gave the following resistance readings as etched, without adjustment.

| Kilohms | Kilohms | Kilohms | Kilohms |
|---|---|---|---|
| 21.63 | 22.41 | 22.50 | 22.93 |
| 22.13 | 22.62 | 22.53 | 22.00 |
| 22.03 | 22.23 | 22.78 | 21.01 |

Another pattern made at a different time gave the following results:

| Kilohms | Kilohms | Kilohms | Kilohms |
|---|---|---|---|
| 22.47 | 22.33 | 22.75 | 23.19 |
| 21.01 | 22.17 | 22.91 | 23.06 |
| 21.06 | 22.28 | 23.16 | 22.87 |

It will also be understood that this invention is not limited to glass-epoxy substrates. Other examples of substrate material are paper-based plastic laminates, polyimides and Teflon.

The present invention is not limited to any particular resistive or conductive metals since such materials are well-known to those skilled in the art. The membrane composition is not critical since any polymer or other material capable of forming a thin porous membrane which can be removed by a solvent is suitable in the practice of my invention.

Having fully described the invention it is intended that it be limited only by the lawful scope of the appended claims.

I claim:

1. The method of forming a printed circuit board material comprising a substrate, a resistive layer carried on said substrate, and a conductive layer carried on said resistive layer wherein resistors can be formed from said resistive layer to narrow tolerance which comprises applying in a plating bath an adherent resistive layer to a preformed conductive layer coated with a porous membrane which is not substantially removed by said plating bath, removing said membrane to yield a unitary composite of superposed conductive and resistive layers joined together, and providing a substrate adhering to said composite with said resistive layer being between said substrate and said conductive layer, whereby said board material is adapted to be used to form by subsequent sequential etching steps a layer of resistors and a layer of conductors electrically connected.

2. The printed circuit board material prepared by the method of claim 1.

3. The method of claim 1 wherein said substrate is a rigid plastic.

4. The method of claim 1 wherein said porous membrane is polymeric.

5. The method of claim 1 wherein said conductive layer is metallic.

6. The method of claim 1 wherein said resistive layer is metallic.

7. The method of claim 1 wherein the conductive layer is copper.

8. The method of claim 1 wherein the resistive layer is nickel-phosphorus.

9. The method of forming a printed circuit board material comprising a substrate, a resistive layer carried on said substrate, and a conductive layer carried on said resistive layer wherein resistors can be formed from said resistive layer to narrow tolerance, which comprises applying in a plating bath an adherent resistive layer to a preformed conductive layer coated with a porous membrane which is not substantially removed by said plating bath, removing said membrane to yield a unitary composite of superposed conductive and resistive layers joined together, and laminating said composite to a plurality of plies of fabric preimpregnated with curable resin to form a rigid substrate with said resistive layer being between said substrate and said conductive layer, whereby said board material is adapted to be used to form by subsequent sequential etching steps a layer of resistors and a layer of conductors electrically connected.

10. The method of forming a printed circuit board material comprising a substrate, a resistive layer carried on said substrate, and a conductive layer carried on said resistive layer wherein resistors can be formed from said resistive layer to narrow tolerance, which comprises applying in a plating bath an adherent resistive layer to a preformed conductive layer coated with a porous membrane which is not substantially removed by said plating bath, removing said membrane with an organic solvent to yield a unitary composite of superposed conductive and resistive layers joined together, and laminating said composite to a plurality of plies of fabric preimpregnated with curable resin to form a rigid substrate with said resistive layer being between said substrate and said conductive layer, whereby said board material is adapted to be used to form by subsequent sequential etching steps a layer of resistors and a layer of conductors electrically connected.

11. The method of claim 1 wherein the porous membrane is polyvinylidene fluoride.

12. The method of claim 1 wherein the porous membrane is cellulose triacetate.

References Cited

UNITED STATES PATENTS

| | | | |
|---|---|---|---|
| 1,885,393 | 11/1932 | Van Schaak | 204—296 |
| 2,574,533 | 11/1951 | Cornwell et al. | 204—296 |
| 2,730,768 | 1/1956 | Clarke | 204—296 |
| 3,276,911 | 10/1966 | Schoeneweis | 204—290 R X |
| 3,297,595 | 1/1967 | Mindic et al. | 204—296 X |
| 3,324,014 | 6/1967 | Modjeska | 156—150 X |
| 3,414,487 | 12/1968 | Helms et al. | 204—13 X |
| 3,450,650 | 6/1969 | Murata | 204—296 X |
| 3,489,666 | 1/1970 | Nordblom et al. | 204—281 X |
| 1,709,801 | 4/1929 | Muller | 204—12 |
| 2,870,068 | 1/1959 | Schaer | 204—11 |
| 2,880,147 | 3/1959 | Cunningham | 204—12 |

FOREIGN PATENTS

| | | |
|---|---|---|
| 274,426 | 12/1927 | Great Britain. |
| 993,392 | 5/1965 | Great Britain. |

OTHER REFERENCES

Ellis, T. L., "Lamination Process," IBM Technical Disclosure Bulletin, vol. 10, No. 1, 1967.

WILLIAM J. VAN BALEN, Primary Examiner

M. A. LITMAN, Assistant Examiner

U.S. Cl. X.R.

117—71, 93; 156—150, 151, 155, 249; 161—216; 204—284, 290